United States Patent [19]
Distefano et al.

[11] Patent Number: 5,868,301
[45] Date of Patent: Feb. 9, 1999

[54] SEMICONDUCTOR INNER LEAD BONDING TOOL

[75] Inventors: Thomas H. Distefano, Monte Sereno; Flynn Carson, Santa Clara, both of Calif.

[73] Assignee: Tessera, Inc., San Jose, Calif.

[21] Appl. No.: 630,375

[22] Filed: Apr. 10, 1996

[51] Int. Cl.$^6$ .................................................. H01L 21/60
[52] U.S. Cl. ...................................... 228/180.21; 228/1.1
[58] Field of Search ..................................... 228/1.1, 44.7, 228/51, 110.1, 111, 180.21; 156/580.2

[56] References Cited

U.S. PATENT DOCUMENTS

| | | |
|---|---|---|
| 4,069,961 | 1/1978 | Nicklaus et al. . |
| 4,776,509 | 10/1988 | Pitts et al. . |
| 4,887,758 | 12/1989 | Suzuki et al. . |
| 5,007,576 | 4/1991 | Congelton et al. . |
| 5,059,559 | 10/1991 | Takahashi et al. . |
| 5,148,967 | 9/1992 | Gabaldon et al. . |
| 5,156,318 | 10/1992 | Suzuki et al. . |
| 5,390,844 | 2/1995 | DiStefano et al. . |
| 5,489,749 | 2/1996 | DiStefano et al. . |
| 5,491,302 | 2/1996 | DiStefano et al. . |

FOREIGN PATENT DOCUMENTS

| | | |
|---|---|---|
| 0 506 112 A1 | 3/1992 | European Pat. Off. . |
| 4-142050 | 5/1992 | Japan . |
| 4-155935 | 5/1992 | Japan . |
| 4-162543 | 6/1992 | Japan . |
| 4-245450 | 9/1992 | Japan . |
| 4-287939 | 10/1992 | Japan . |

OTHER PUBLICATIONS

Carlson, J., "Recent Advances in Single Point Tab Bonding Tools", ©1990, pp. 1–6.

*Primary Examiner*—Samuel M. Heinrich
*Attorney, Agent, or Firm*—Lerner, David, Littenberg, Krumholz & Mentlik

[57] ABSTRACT

A lead bonding tool for bonding leads to respective semiconductor chip contacts. The bonding tool having a substantially flat bonding surface region with a depression therein. The depression allows the tool to grasp the lead during the bonding step and further facilitate the transmission of energy from the tool to the lead/contact interface to form the bond. Certain embodiments of the lead also have grooves and/or guides which are adapted to capture and better align the elongated lead sections with their respective chip contacts during the bonding step.

19 Claims, 6 Drawing Sheets

SEMICONDUCTOR INNER LEAD BONDING TOOL

FIELD OF THE INVENTION

The present invention relates to the field of semiconductor chip mounting and connection, and more particularly relates to tools and methods for bonding electrical leads to contacts on a semiconductor chip.

BACKGROUND OF THE INVENTION

Semiconductor chips are connected to external circuitry through electrical contacts on a face surface of the chip. The contacts on the chip typically are disposed in the regular patterns such as a grid substantially covering the front surface of the chip, commonly referred to as an "area array" or in elongated rows extending parallel to and adjacent each edge of the chip face surface. Each contact on the chip must be connected to external circuitry, such as the circuitry of a supporting substrate or circuit panel. Various processes for making these interconnections use prefabricated arrays of leads or discrete wires. For example, in a ball or stitch bonding process using a wirebonder, the chip is physically mounted on the substrate. A fine wire is fed through a bonding tool. The tool is brought into engagement with the contact on the chip so as to bond the wire to the contact. The tool is then moved to a connection point of the circuit on the substrate, so that a small piece of wire is dispensed and formed into a lead, and connected to the substrate. This process is repeated for every contact on the chip.

In the so-called tape automated bonding or "TAB" process, a dielectric supporting tape, such as a thin foil of polyimide is provided with an aperture slightly larger than the chip. An array of metallic leads is provided on one surface of the dielectric film. These leads extend inwardly from around the aperture towards the edges of the aperture. Each lead has an innermost end projecting inwardly, beyond the edge of the aperture. The innermost ends of the leads are arranged side by side at spacing corresponding to the spacing of the contacts on the chip. The dielectric film is juxtaposed with the chip so that the aperture is aligned with the chip and so that the innermost ends of the leads will extend over the front or contact bearing surface on the chip. The innermost ends of the leads are then bonded to the contacts of the chip, as by ultrasonic or thermocompression bonding. The outer ends of the leads are connected to external circuitry.

In a so-called "beam lead" process, the chip is provided with individual leads extending from contacts on the front surface of the chip outwardly beyond the edges of the chip. The chip is positioned on a substrate with the outermost ends of the individual leads protruding over contacts on the substrate. The leads are then engaged with the contacts and bonded thereto so as to connect the contacts on the chip with contacts on the substrate.

The rapid evolution of the semiconductor art in recent years has created a continued demand for progressively greater numbers of contacts and leads in a given amount of space. An individual chip may require hundreds or even thousands of contacts, all within the area of the chip face surface. For example, a complex semiconductor chip in current practice may have a row of contacts spaced apart from one another at center-to-center distances of 0.1 mm or less and, in some cases, 0.05 mm or less. These distances are expected to decrease progressively with continued progress in the art of semiconductor fabrication.

With such closely-spaced contacts, the leads connected to the chip contacts, such as the wires used in wirebonding leads in the tab process and beam leads must be extremely fine structures, typically having a smaller bonded surface than the contacts onto which they are bonded so that the adjacent lead do not electrically short. Such fine structures are susceptible to damage and deformation. With closely spaced contacts, even minor deviations of a lead from its normal position will result in misalignment of the leads and contacts. Thus, a given lead may be out of alignment with the proper contact on the chip or substrate, or else it may be erroneously aligned with an adjacent contact. Either condition will yield a defective chip assembly. Errors of this nature materially reduce the yield of good devices and introduce defects into the product stream. These problems are particularly acute with those chips having relatively fine contact spacing and small distances between adjacent contacts.

Commonly assigned U.S. patent application Ser. No. 07/919,772, filed Jul. 24, 1992 (the "772 application") and issued U.S. Pat. No. 5,489,749 which is a divisional thereof, the disclosures of which are incorporated by reference herein, describes an improved system for connecting semiconductor chips to external circuitry. Certain embodiments of the invention set forth in the '772 application utilize a connection component having a support structure and electrically conductive leads. Each lead has a connection section extending across a gap in the support structure. The connection sections of the leads are flexible. Preferably, one end of each lead is detachably secured to the support structure, whereas the other end is permanently secured to the support structure and connected to a terminal mounted on the support structure. The connection component is positioned on a part of a semiconductor chip assembly, such as the chip itself, so that the leads overlie contacts on the part or chip. The connection sections of the leads are bonded to the contacts on the chip by engaging each connection section with a tool, forcing the tool downwardly to break the detachable end of the lead from the support structure and bring the connection section into engagement with a contact on the chip. The tool is used to apply pressure and/or ultrasonic vibrations to the lead, thereby forming a bond between the lead and the contact of the chip. This process is repeated for each lead, until all the leads have been bonded to the contacts on the chip. After the connection component has been electrically connected to the contacts of the chip, the terminals of the connections component can be used to connect the chip to other, external circuitry as, for example, by bonding the terminals of the connection component to an external substrate such as a circuit panel.

In the preferred arrangements disclosed in the '772 application, the bonding tool is arranged to capture and align the lead. Thus, the bonding tool may be a blade-like device with an elongated bottom edge and with a groove extending lengthwise along such bottom edge for engaging leads to be bonded. The groove may have a central plane and surfaces sloping upwardly from the sides of the groove towards the central plane. When the tool is roughly aligned with a lead, so that the lengthwise axis of the bottom edge and groove are generally parallel to the lengthwise axis of the connection section of the lead, the groove will engage the lead and guide it into precise alignment with the tool. Thus, the tool can be aligned in sequence with each contact, and engaged with a lead. Even if the lead is slightly out of alignment with the contact and tool at the beginning of the operation, the tool will bring the lead into precise alignment with the tool and hence with the contact during the downward motion of the tool. Thus, minor dimensional variations in the connection component do not impede the process, even where the contacts are provided at very small spacing.

The preferred embodiments described in the '772 application are highly advantageous, but still further improvement would be desirable. In many cases, the connection sections of different leads extend in different, mutually orthogonal directions. For example, many common chips are generally rectangular and have contacts disposed in rows extending along the edges of the chip. The rows of contacts on adjacent edges extend in mutually orthogonal directions. The connection sections of the leads associated with each row of contacts on the chip must be arranged side by side, so that the connection sections of the leads extend orthogonally to the length of the row. Thus, where the rows of contacts extend in mutually orthogonal directions along different edges of the chip, the connection sections of the leads likewise extend in mutually orthogonal directions. Typically, the tool is positioned so that the lengthwise axis of the bottom edge extends parallel to the connection sections in one row, and the tool is then advanced stepwise down the row, bonding each of the leads in the row seriatim. When the row is completed, the chip and support structure must be rotated 90° relative to the tool so as to properly align the tool for engagement with the connection sections of the next row.

The rotation step consumes appreciable time in production and requires that the apparatus be equipped with a precise, rotatable stage or mounting. Moreover, the rotation step can introduce additional misalignments between the connection sections and the tool.

Commonly assigned U.S. Pat. No. 5,390,844, incorporated herein by reference, deals effectively with this problem. One embodiment of that patent provides a bonding tool for bonding leads to contacts on semiconductor chips wherein the lower end of the tool defines guide surfaces for engaging elongated leads disposed beneath the lower end of the tool upon downward movement of the tool from above the leads. The guide surfaces are adapted to engage a lead extending in either of two mutually orthogonal directions and to center the engaged lead beneath the bonding region of the lower end so that the lead can be engaged and bonded by the tool. With either orientation of the lead, the tool will capture and align the lead, and bring the lead into position for bonding. Thus, a tool in accordance with this aspect of the present invention can be used in procedures generally similar to those discussed above with reference to the '772 application and in bonding TAB-like cantilevered leads. However, where the leads on the connection component extend in two mutually orthogonal directions, there is no need to rotate the connection component and chip relative to the tool during the process. Where the contacts are arranged in rows, the tool can simply be advanced along one row, then advanced along another row, until the process is complete. Other embodiments and improvements are further disclosed in the '844 patent.

Proper bonding of the leads to respective chip contacts is also important. Typically, the leads are bonded to the chip contacts by the bonding tool using heat, force, ultrasonic energy, or a combination of two or more thereof, for a given time period. If an incorrect ratio of force, heat and/or ultrasonic energy is used, the bond between the leads and the contacts may be too weak to undergo the thermal cycling stress during operation of the chip (heating and cooling cycles during operation). The bonding tool may create areas of the lead which are prone to early fatigue during thermal cycling because of excessive non-uniform deformations in the bonding region typically causing early breaks in the lead at the point the lead bends up from the chip surface (commonly referred to as a "heel break"). Further, obtaining good intermetallic bonds which are substantially uniform across the surface of the bond between the lead and contact surfaces is critical to a well performing lead bond. Uneven intermetallic growth can cause embrittlement of the lead in and around the bond area thereby causing early fatigue of the lead during thermal cycling. Intermetallic diffusion will typically only take place at the bonded sites of the lead and the contact thereby causing sites of gross intermetallic formation which may cause an unreliable bond. Further, impurities in the bond lead (such as co-deposited plated lead impurities or other surface impurities) tend to migrate to the unevenly bonded intermetallic sites during the high temperatures used in chip packaging thus weakening the bond. Both of these problems may worsen the creation of a phenomenon called Kirkendahl Voiding (voids created at the boundary of two metals having different interdiffusion coefficients). This voiding along the boundary of the two metals (lead/contact) generally causes intermetallic degradation, brittleness of the lead itself and weakening of the bond making the lead/bond susceptible to failure during thermal cycling.

Figure 1A:
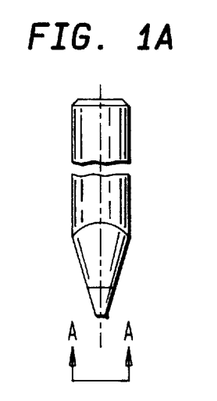
FIG. 1A is a fragmentary side view of a single point bonding tool.
Figure 1B:
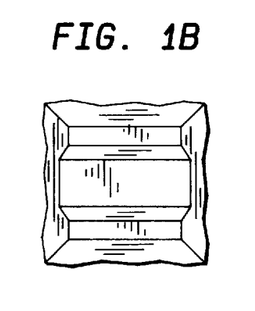
FIGS. 1B–1G are fragmentary bonding surface views taken along line A—A in FIG. 1A of various prior art bonding tool bonding surface designs.
Figure 1C:
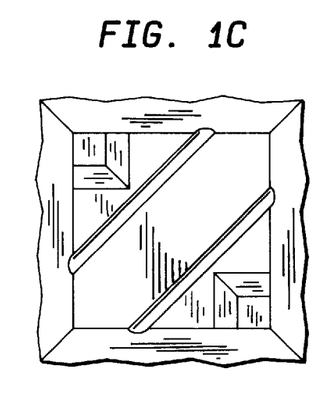
Figure 1D:
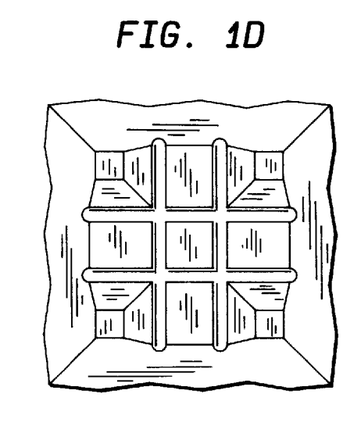
Figure 1E:
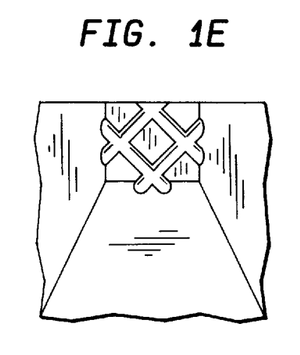
Figure 1F:
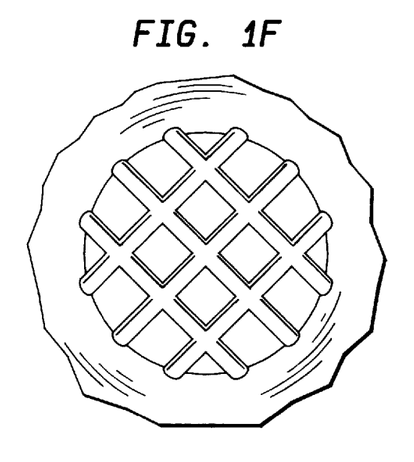
Figure 1G:
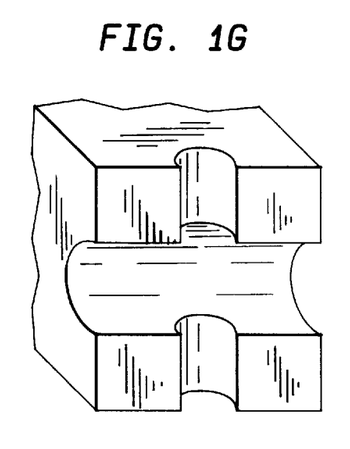
Figure 1H:
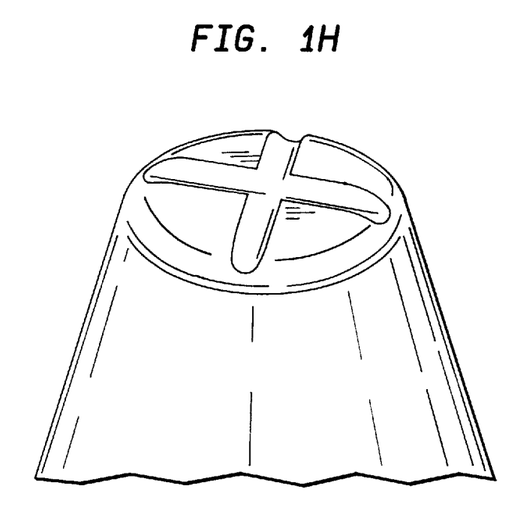
FIG. 1H is a fragmentary side view of a typical prior art bonder tool.

As chip packages are made smaller and smaller, the lead dimensions will also be reduced compounding this problem by making it more difficult to reliably bond the leads to their respective chip contacts using conventional bonding tools. FIG. 1A shows a fragmentary side view of a single point bonding tool. FIGS. 1B–1G show the bonding surface view (view A—A from FIG. 1A) of various prior art lead bonding tool designs which have the tendency to cause the aforementioned problems especially as the lead dimensions continue to get smaller. A drawing of a typical bonder tool is depicted in FIG. 1H. The tool in FIG. 1H has a cross groove formed into the bonding surface region of the tool. Each bonding surface shown in FIGS. 1B–H is designed with the intent to maximize the coupling of the energy from the tool to form a good bond between the lead and a contact. The tools are typically made of very hard materials which are electrically conductive as they are manufactured using electrodischarge machining to obtain the ultra-fine features. The cross grooves in the tool shown in FIG. 1H are about 10 micrometers wide, as limited by the aforementioned electroforming process. The various groove designs on the bonding surfaces of the bonding tools discussed above have the tendency to cut too deeply or make too deep of an impression in finely dimensioned leads during the bonding of the leads to respective chip contacts potentially causing weak portions of the leads which are more likely to break during thermal cycling of the device and more likely to cause non-uniform bonding conditions, as described earlier. Also, potential problems maybe cause by "cratering" the surface of the chip contacts during bonding by placing too much concentrated force on the fine leads.

Despite the substantial time and effort devoted heretofore to the problems associated with providing bonding tools, there are still unmet needs for improvements in such semiconductor chip package structures and methods.

SUMMARY OF THE INVENTION

The present invention addresses these needs.

The present invention includes a bonder tool for bonding leads to semiconductor chip contacts. In a first embodiment, the tool has a body with a lower end defining a substantially flat bonding surface region. There is a depression within the bonding surface region which is used to grasp the lead during the bonding of the lead to a respective chip contact so that the bonding energy may be more easily transmitted from the tool to the lead/contact interface. Typically, the depression is approximately centrally located in the bonding surface. During the bonding process, the motion of the bonder tool causes the metal from the lead to deform into the depression in the tool. Desirably, the side wall or side walls of the depression will not be orthogonal with respect to the bonding surface region so that it is less likely that the lead material will get stuck and plug up the depression during the bonding cycle thereby making future lead bonding more difficult. The desirable shape of a bonder tool depression is dependent on the dimensions of the leads and the dimensions of the bonder tool itself; however, some examples of depression shapes include hemispherical, conical, truncated conical, and pyramidal.

The bonder tool may also include grooves disposed on the sides of the tool perpendicular to bonding surface such that each groove slopes, typically in an arcuate shape, from the bonding surface to a side region of the bonder tool. The grooves are adapted to engage and "capture" an elongated lead within a groove upon downward movement of the tool so as to facilitate the alignment of such lead with a respective chip contact. The top of the grooves may be integral with the body of the tool or may protrude out from the body of the tool such that guides are created, each guide including two rails on either side and a central groove integral with the tool body. Typically, the grooves or guides are located either along a central axis on two opposite sides of the bonding surface or on all four sides of the bonding surface where each groove or guide is approximately orthogonal with respect to the two immediately adjacent grooves/guides.

In a method of using the aforementioned bonder tool, according to the present invention, a connection component having leads with elongated connection sections overly the chip such that the leads are in rough alignment with respective chip contacts. A particular lead is next engaged by the bonding surface of the tool as the tool travels generally in a downward direction towards the respective chip contact, wherein the tool brings the lead into better alignment and engagement with the chip contact. The bonder machine next directs energy through the tool to the lead while the lead is adjacent the contact wherein the aforementioned depression in bonding surface of the tool grasps the lead during the bonding operation and helps to transmit energy from the tool to the lead. Further, the relatively small dimensions of the depression in relation to the lead allow substantially uniform intermetallic bonds at the interface between the lead and contact. Typically, the transmitted energy is heat, compressional force, vibration or some combination thereof to bond the lead to the contact. Examples of such energy include ultrasonic energy, thermosonic energy or thermocompression energy. As described above, a groove or guide may be used to facilitate the alignment of the elongated leads with their respective chip contacts.

The foregoing and other objects and advantages of the present invention will be better understood from the following Detailed Description of a Preferred Embodiment, taken together with the attached Figures.

DETAILED DESCRIPTION OF THE PREFERRED EMBODIMENTS

Figure 2A:
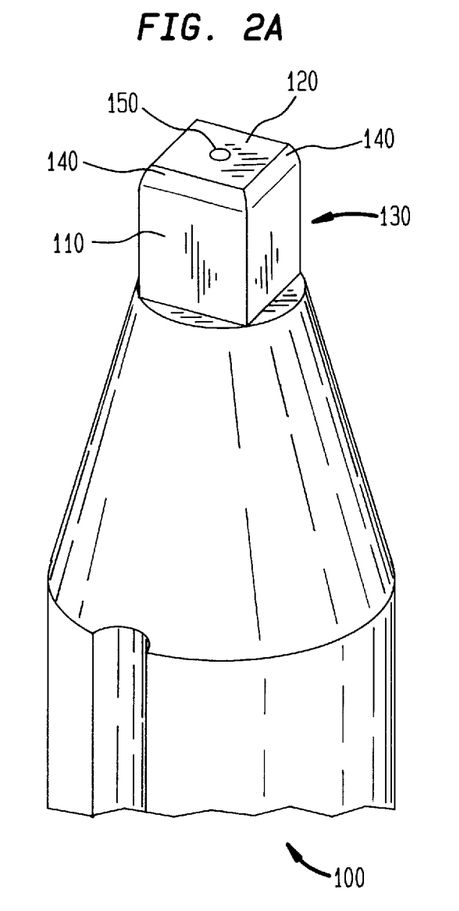
FIGS. 2A–2C are perspective, top and side views, respectively, of a single point bonding tool, according to the present invention.
Figure 2B:
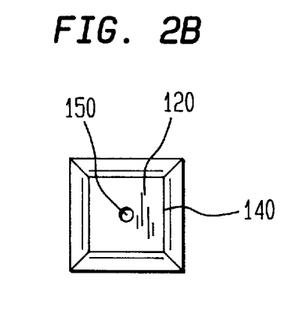
Figure 2C:
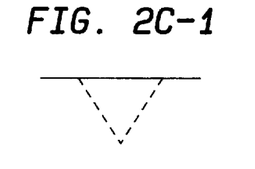
Figure 2C:
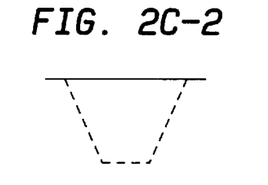
Figure 2C:
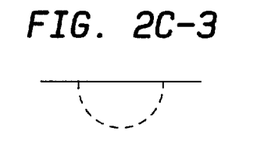
Figure 2C:
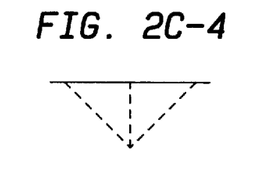
Figure 2C:
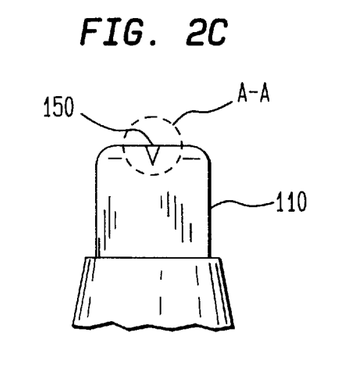

FIG. 2A shows a perspective view, FIG. 2B a top plan view and FIG. 2C a side view of a bonder tool 100, according to the present invention. The tool 100 in accordance with this embodiment includes a head 130 having a bonding surface region 120. The bonding surface region 120 is desirably substantially flat so that when the head 130 engages a lead on a semiconductor package and bonds it to a chip contact, an even, uniform intermetallic interface (or bond) between the lead and the chip contact can be formed. The head 130 has side walls 110 which slope into the between the bonding surface 120 at the transition radius 140. In the embodiment shown in FIGS. 2A–C, there are several side walls 110; however, a substantially cylindrical side wall 110 may also be used, such that the side wall is a surface of revolution which gently transitions from the side wall 110 into the bonding surface region 120.

The tool 100 further includes a depression 150 in the bonding surface region 120 which is used to grasp the lead during the step of bonding the lead to a chip contact (described below) thereby better coupling the tool to the lead and further facilitating the transference of energy from the tool to the lead. The depression may generally be of any shape, as shown in the examples of the magnified views of A—A in FIGS. 2C–1 through 2C–4. However, preferably, the walls of the depression 150 are not perpendicular with the bonding surface 120 so as to potentially cause a problem with lead material sticking in the depression 150 and plugging the depression during bonding of a lead and thereby potentially hampering any future bonding of leads to contacts with that particular tool. Further, desirably, the lead and bonder tool materials should not be comprised of materials which cause the lead to stick to the bonder tool and/or plug the depression. Depression 150 is entirely surrounded by the substantially flat region 120 of the bonding surface. Thus, the depression is in the form of a spot within the substantially flat region, rather than in the form of a groove extending entirely across the flat region to the edges of the flat region.

FIGS. 2C–1 through 2C–4 show examples of possible depression 150 shapes. In FIG. 2C–1, the depression includes a substantially cone-shaped aperture. FIG. 2C–2 shows a truncated cone-shape aperture. FIG. 2C–3 shows a hemispherical aperture. FIG. 2C–4 shows a pyramid-like aperture having several side walls. Typically, the depression 150 is centrally located in the bonding surface region 120; however, it may be positioned at any desired position on the bonding surface 120 in order to maximize the bond strength of the lead to a respective chip contact. The desired dimensions of a depression 150 depend greatly on the lead dimensions and configurations—the smaller the lead is (both in width and thickness) generally the smaller the depth and diameter of the depression will be. For example, for a one mil lead, the depression may have a depth of about 10 to 20 micrometers and a diameter of about 10 to 20 micrometers. The depth and diameter of the depression should be sufficient to adequately grasp the lead during bonding so as to couple the tool to the lead such that sufficient energy is transmitted to uniformly bond the lead to the chip contact. Preferably, the depression diameter should be between 50% to 100% of the lead width and have a depth which is approximately one-half of the diameter, such as a tool which has a depression that has a 18 micrometer diameter and a depression depth of 10 micrometer. As used in this disclosure, the diameter of the depression should be taken as the largest dimension of the depression in the plane of substantially flat region 120, i.e., the largest dimension of the depression across the opening of the depression. Desirably, the diameter of the depression is between about 5% and about 40% of the minimum dimension of flat region 120 in the plane of the flat region, and more preferably between about 5% and about 25%.

Figure 3A:
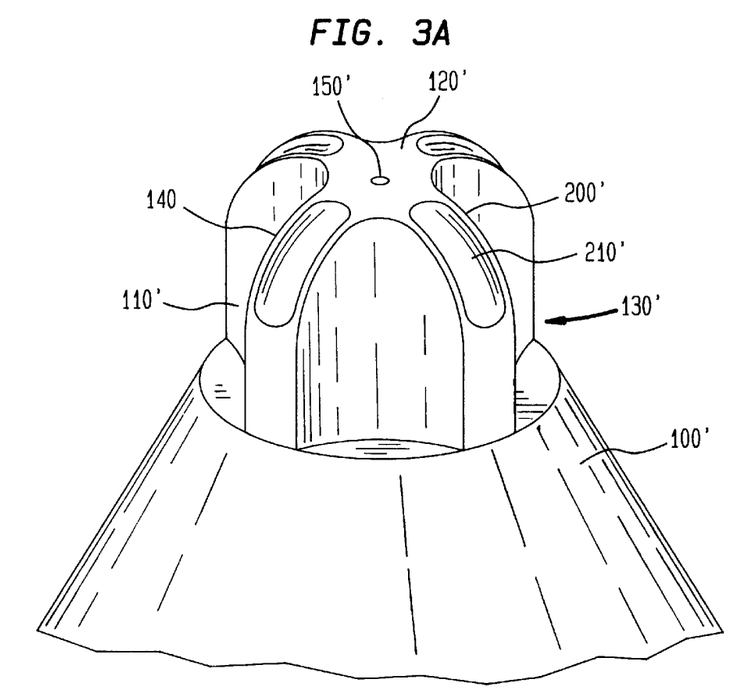
FIGS. 3A–3C are perspective, side and top views, respectively, of a four-way single point bonding tool, according to the present invention.
Figure 3B:
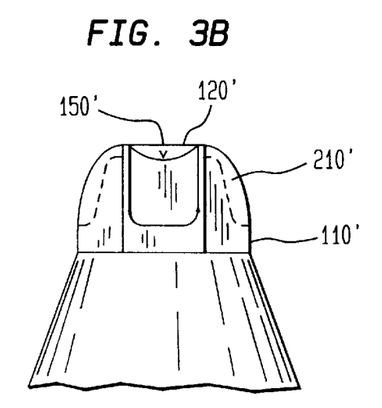
Figure 3C:
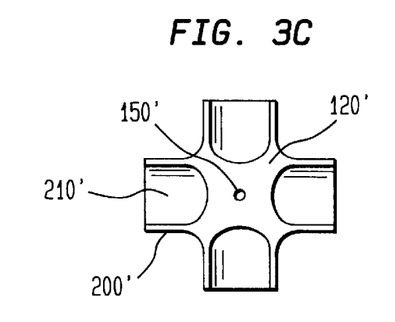

FIG. 3A shows a fragmentary perspective view, FIG. 3B a side view and FIG. 3C a top plan view of another bonder tool embodiment, according to the present invention. As described above in connection with the embodiments found in FIGS. 2A–C, the bonder tool 100' in FIG. 3A has a head 130', a bonding surface region 120' and a depression 150' within the bonder surface region 120' for grasping the leads during the bonding step. However, this embodiment further includes guides each comprising two rail portions 200' having grooves 210' therein. The grooves 210 extending from the bonding surface 120' along and within the side regions 110' following the transition radius 140' from the bonding surface 120' to the side regions 110' giving each groove 210' a generally arcuate shape from the bonding surface 120' to the respective side region 110' of the tool. The grooves are adapted to receive and engage the elongated leads upon the downward motion of the tool as the leads are being bonded to respective chip contacts so that the leads may be accurately aligned therewith. Desirably, the grooves 210' gradually transition into the bonding surface 120' such that the grooves can be used to align the leads for bonding, but do not result in a crimped or kinked lead due to an edge of the groove when the lead is bonded.

Figure 3D:
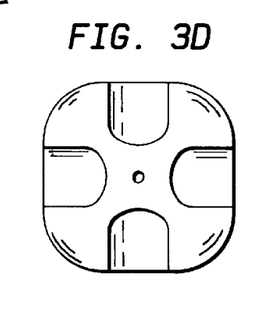
FIG. 3D is a top view of an alternate four-way single point bonding tool, according to the present invention.
Figure 6:
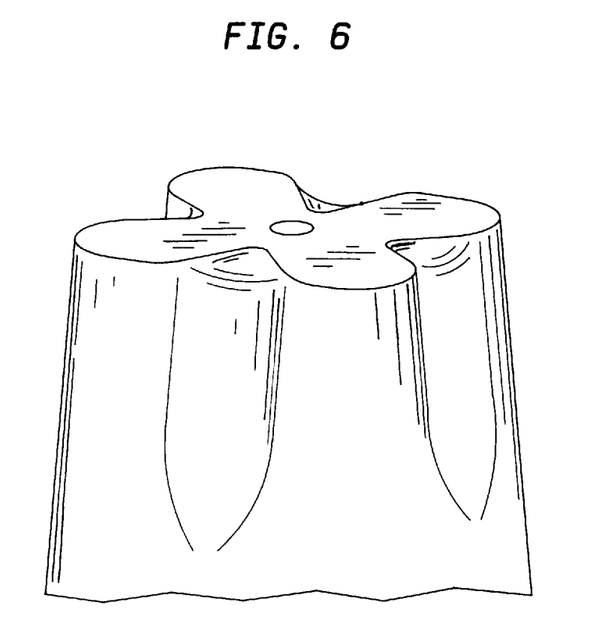
FIG. 6 is a fragmentury side view of a manufactured bonder tool, according to the present invention, magnified 400 times its normal size.

The embodiment shown in FIGS. 3A–C has four such guides/grooves each arranged orthogonally with respect to the two adjacent guides/grooves so that a standard wire bonder may use the bonding tool 100' to bond the leads on a semiconductor package arranged on all four perimeter edges of the package without re-positioning the chip or package in the wire bonder. FIG. 3D shows a top plan view of an alternate embodiment in which the top of the grooves is flush with the head of the tool instead of being within individual guides/rail portions. FIG. 6 shows a manufactured bonder tool, according to the present invention.

Figure 4:
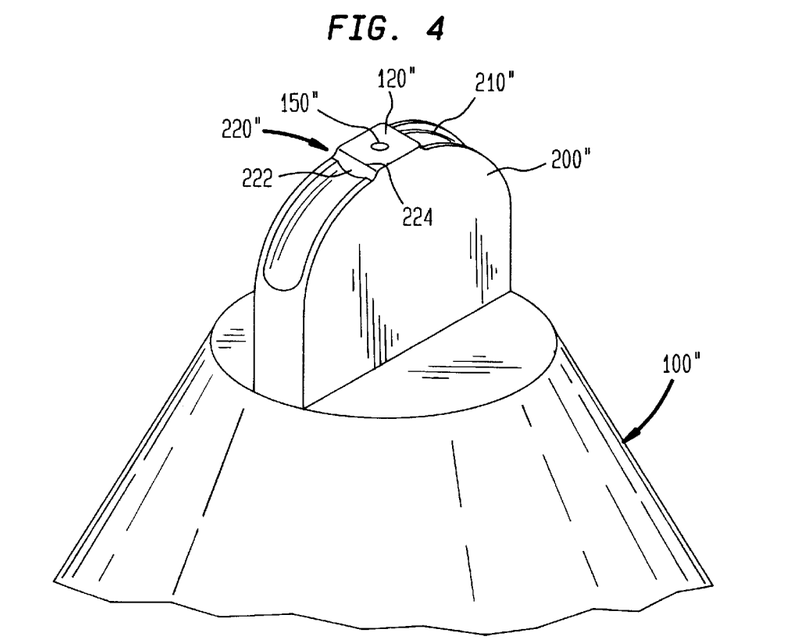
FIG. 4 is a perspective view of a two-way single point bonding tool, according to the present invention.

FIG. 4 shows a perspective view of a further bonder tool 100", according to the present invention, similar in design to the tool shown in FIGS. 3A–C. The bonder tool 100" in FIG. 4, however, has only two guides 200', instead of the four guides 200 shown in the embodiment of FIG. 3A. The guides 200' are located on opposite sides of the bonding surface region 120'. Thus, this tool would generally be used to bond leads which are located on two opposite edges of a semiconductor package, instead of all four edges of the periphery of the package. However, it could be used to bond the leads on a package having leads on all four edges if the leads on two opposite sides are first bonded and then the part is turned so that the remaining two opposite side leads may be bonded. Further, this tool 100" would be good for center bonded packages in which the chip contacts are aligned in the center of the face of the chip and the leads extend and overly respective contacts from both sides of a center bond window in the package.

Figure 5A:
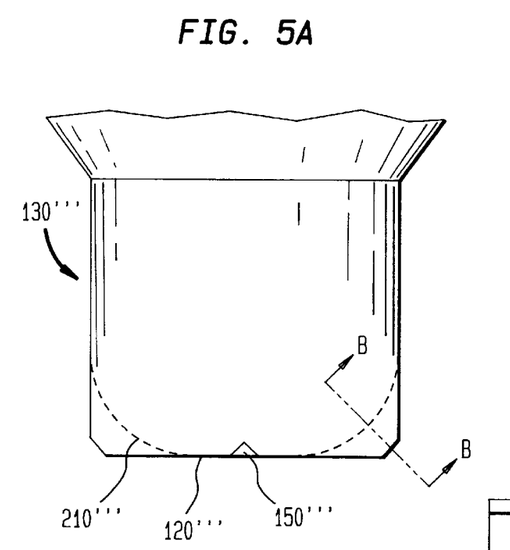
FIGS. 5A and 5B are side and top views, respectively, of an alternate two-way single point bonder tool, according to the present invention.
Figure 5B:
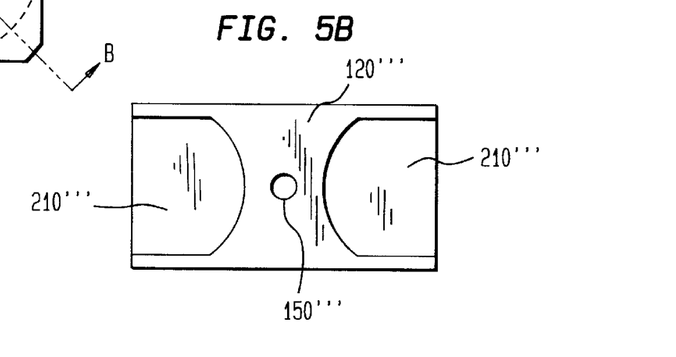
Figure 5C:
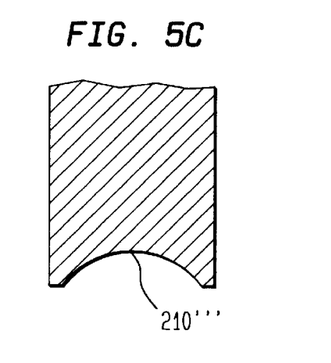
FIG. 5C is a crossectional view taken along line B—B in FIG. 5A of a grooved portion of the tool, according to the present invention.

As described above in connection with the embodiment shown in FIGS. 3A–C, desirably, the grooves 210" gradually transition into the bonding surface 120', as shown at transition region 220", such that the grooves can be used to align the leads for bonding, but do not result in a crimped or kinked lead due to an edge of the groove when the lead is bonded. However, the transition region 220" in this embodiment includes a raised bonding surface region 120" such that the groove 210" typically has a concave radius 222" at the point of first transition from the groove and a convex radius 224' at the point of transition to the bonding surface 120' so that the surface of the transition region is somewhat "S"-shaped. This arrangement allows a user to control the radius of the bonded lead as it leaves face surface of the semiconductor chip so as to alleviate stress at the heel of the bonded lead. FIGS. 5A–C show a similar alternative two-groove embodiment in which the groove is within a top corner of the head 130'" itself, as described in FIG. 3D. In the FIG. 5 embodiment, the transition region 220" from FIG. 4 simply amounts to a continuation of the arcuate surface of the groove 210'" into the flat bonding surface 120'".

Typically, the tools described above will be made of materials such as tungsten carbide, titanium carbide, machineable ceramic, diamond, osmium, rhodium and tool steel. Combinations of several materials can also be employed.

In a method of bonding leads to respective chip contacts according to one embodiment of the present invention, the earlier described tools are held in a wirebonder machine, such as Model 1488 from Kulicke & Soffa Industries, Inc. located in Willow Grove, Pa. A semiconductor chip or other similar part having rows of electrical chip contacts is juxtaposed with a connection component having elongated leads thereon. The chip typically has the contacts extending either on each of the periphery sides of the face surface of the chip, on two opposing sides of the periphery of the face surface of the chip or along a central axis of the face surface of the chip. The leads on the connection component are arranged such that they roughly vertically overly and are in crude horizontal alignment with respective chip contacts. The leads are typically further disposed side-by-side adjacent one another so that rows of leads extend along the periphery of the connection component on at least two edges.

The leads are then engaged by the bonding surface of the bonder tool, as described more fully above. The tool is generally traveling in a downward direction toward a chip contact upon engagement with a lead. If the lead is intentionally offset from its respective chip contact, the direction of travel of the bonder tool may also have a horizontal component, as described in more detail in U.S. Pat. No. 5,491,302 commonly assigned and incorporated by reference herein. The lead is further aligned with its respective chip contact using the motion of the bonder tool and brought to rest upon its respective chip contact. The wirebonder then typically uses some combination of heat, force and vibration for a given period of time to bond the lead material to the chip contact, such as thermo-compression, ultrasonic or thermosonic energy. During this bonding step, the aforementioned depression 150 in the bonder head 130 "grasps" the lead by making an impression in the lead with the bonding surface 120 while allowing the portion of the lead beneath the depression to enter into the depression cavity. Less force/energy will be transmitted to the area of the lead beneath the depression; however, since the diameter of the depression is small (as discussed above), the bond between the lead and the chip contact is substantially uniform and will develop a substantially uniform layer of intermetallic growth therebetween. The tool is then moved along the row of leads such that it is properly indexed with the next lead/chip contact and the bonding step is repeated again until all of the leads in that row are bonded. The tool is then indexed to a lead/chip contact in another row until all of the leads on a particular device are bonded to respective chip contacts.

In the embodiments shown in FIGS. 3–6, the grooves further facilitate the alignment of the leads to their respective chip contacts by "capturing" the lead within the groove such that the lead moves adjacent the side wall of the tool as the bonder tool moves vertically (and perhaps horizontally) to align and bond the lead to a chip contact. The groove should be at least slightly wider than the leads so that when the elongated lead is engaged and bent downward the lead rests against the inner surface of the groove and is prevented from prematurely leaving the groove by the groove side walls on either side of the captured lead. As described above, the transition radius of the groove from the bonding surface 120 to the side walls 110 of the head 130 can thus be used to shape the lead and can also be used to control the angle the lead leaves the surface of the chip contact thereby helping to reduce the stress of the lead during thermal cycling of the operational packaged device.

As described above, the tools shown in FIGS. 4 and 5 are preferably used to bond the leads on a semiconductor package, where the leads are located on opposite edges of the package and oriented parallel to the orientation of the grooves in the tool. In other words, these are two-way bonding tools. If the leads are located on all four side of a semiconductor package, the lead on opposite edges can be bonded by such a two-way tool and the chip/package assembly may be turned 90 degrees to bond the lead on the remaining two opposite edges. Alternately, a four-way tool may be used as shown in FIGS. 3 and 6 may be used to align the leads extending from all four edges without reorientation of the chip/package assembly.

Although the discussion above refers to use of the tool with connection components having leads arranged side by side in rows to match rows of contacts on the perimeter of the chip, similar processes can be employed where the contacts of the chip, and hence the leads, are disposed in other patterns. For example, the contacts of the chip may be disposed in a so-called "area array", i.e., an array or grid of contacts covering a substantial portion of the chip surface. In such an area array, the contacts may be arranged in patterns other than rectilinear rows and columns. The connection component typically is provided with apertures at locations matching the locations of the contacts on the chip and with one lead extending over such apertures. The bonding tool is indexed relative to the chip and connection component to bring the tool into alignment with each aperture and lead in sequence. While the tool is aligned with each aperture, the tool is advanced downwardly into the aperture, thereby engaging the lead and forcing the lead into engagement with the contact of the chip.

A further embodiment of the present invention may include more than one depression within the bonding surface region in order to better "grasp" the lead to create a better bond between the lead and its respective chip contact.

As numerous other variations and combinations of the features set forth above can be utilized without departing from the present invention as defined by the claims, the foregoing description of the preferred embodiment should be taken by way of illustration rather than by way of limitation of the present invention.

What is claimed is:

1. A tool for bonding leads to contacts on semiconductor chips, the tool comprising:
    a body having a lower end defining a substantially flat bonding surface region, wherein the bonding surface region has a depression therein to grasp the surface of a lead during the bonding of the lead to a respective chip contact so that the bonding energy may be more easily transmitted from the tool to a lead/contact interface, said depression being in the form of a spot entirely surrounded by said substantially flat bonding surface region.

2. The tool as claimed in claim 1, wherein the depression is substantially centrally located with respect to the bonding surface.

3. The tool as claimed in claim 1, further comprising more than one depression in the bonding surface region.

4. The tool as claimed in claim 1, wherein the depression has at least one side wall, wherein the side wall of the depression is not orthogonal to the bonding surface.

5. The tool as claimed in claim 4, wherein the shape of the depression is selected from the group of shapes consisting of hemispherical, conical, truncated conical, and pyramidal.

6. The tool as claimed in claim 1, further comprising grooves disposed on opposite sides of the bonding surface wherein each groove slopes from the bonding surface to a side region of the tool generally perpendicular with the bonding surface, the grooves adapted to engage elongated leads upon downward movement of the tool from above such leads so as to align such lead with a respective chip contact.

7. The tool as claimed in claim 6, wherein the grooves are at least slightly wider than the leads.

8. A tool as claimed in claim 6, further comprising two grooves disposed along opposite edges of the bonding surface region.

9. A tool as claimed in claim 6, further comprising four grooves, wherein each groove is disposed in an orthogonal alignment with respect to the two immediately adjacent grooves.

10. A tool as claimed in claim 6, wherein the grooves follow a generally arcuate shape from the bonding surface to the respective side region of the tool.

11. A tool as claimed in claim 6, wherein each groove is disposed between and integral with two rails protruding from the body of the tool on either side of the groove.

12. A tool as claimed in claim 6, further comprising a generally arcuate transition region from the groove to the bonding surface region.

13. A tool as claimed in claim 6, further comprising a raised bonding surface region wherein the groove transitions into a concave radius which then transitions to a convex radius which next transitions into the bonding surface region.

14. A tool as claimed in claim 6, wherein the groove is concave.

15. A method of making connections to contacts on the front surface of a semiconductor chip comprising the steps of:
   (a) juxtaposing a connection component having leads with elongated connection sections extending in a first direction with the part so that the connection sections of the leads on the connection component overly and are in crude alignment with the chip contacts;
   (b) aligning the connection section of each lead to a respective contact by engaging the lead in a downward direction with a bonding surface of a tool and thereby bringing the connection section into more precise alignment and engagement with the contact; and
   (c) bonding the lead to the contact after the aligning step by transmitting energy from the tool to the lead while the lead is adjacent the contact wherein the bonding tool has a substantially flat region with a depression entirely surrounded by the flat region, and said bonding step is performed so as to engage the flat region with the lead so that the depression in the flat region of the bonding surface of the tool grasps the lead during the bonding operation and helps to transmit energy from the tool to the lead.

16. The method as claimed in claim 15, wherein the bonding step further includes using heat, force, vibration or some combination thereof to bond the lead to the contact.

17. A method as claimed in claim 16, wherein the energy is selected from the group consisting of energy include ultrasonic energy, thermosonic energy and thermocompression energy.

18. A method as claimed in claim 16 wherein the aligning step further includes engaging each lead with a groove disposed within the tool so as to capture the lead therein and align the lead with a respective contact.

19. A method as claimed in claim 15, wherein the bonding step further includes forming the lead so as to alleviate thermal cycling stress in the lead.

* * * * *

UNITED STATES PATENT AND TRADEMARK OFFICE
CERTIFICATE OF CORRECTION

PATENT NO. : 5,868,301
DATED : Feb. 9, 1999
INVENTOR(S) : DiStefano et al.

It is certified that error appears in the above-identified patent and that said Letters Patent is hereby corrected as shown below:

Column 8, line 2, "120' " should read --120"--.

Column 8, line 24, "224' " should read --224"--.

Column 8, line 24, "120' " should read --120"--.

Column 8, line 30, "comer" should read --corner--.

Signed and Sealed this

Sixth Day of July, 1999

Attest:

Q. TODD DICKINSON

*Attesting Officer*          *Acting Commissioner of Patents and Trademarks*